(12) United States Patent
Zheng

(10) Patent No.: US 10,407,300 B2
(45) Date of Patent: Sep. 10, 2019

(54) INTEGRATED STRUCTURE OF MEMS PRESSURE SENSOR AND MEMS INERTIA SENSOR

(71) Applicant: Goertek.Inc, Weifang, Shandong (CN)

(72) Inventor: Guoguang Zheng, Weifang (CN)

(73) Assignee: Goertek.Inc, Weifang, Shandong (CN)

( * ) Notice: Subject to any disclaimer, the term of this patent is extended or adjusted under 35 U.S.C. 154(b) by 98 days.

(21) Appl. No.: 15/554,652

(22) PCT Filed: Dec. 14, 2015

(86) PCT No.: PCT/CN2015/097314
§ 371 (c)(1),
(2) Date: Aug. 30, 2017

(87) PCT Pub. No.: WO2016/192372
PCT Pub. Date: Dec. 8, 2016

(65) Prior Publication Data
US 2018/0044174 A1 Feb. 15, 2018

(30) Foreign Application Priority Data

May 29, 2015 (CN) .......................... 2015 1 0288750

(51) Int. Cl.
*B81B 7/02* (2006.01)
*G01L 9/12* (2006.01)
(Continued)

(52) U.S. Cl.
CPC .............. *B81B 7/02* (2013.01); *B81B 3/0021* (2013.01); *B81B 7/0061* (2013.01);
(Continued)

(58) Field of Classification Search
CPC ......... B81B 7/02; B81B 7/0061; B81B 7/007; B81B 7/0074; B81C 1/00166;
(Continued)

(56) References Cited

U.S. PATENT DOCUMENTS 5,369,544 A * 11/1994 Mastrangelo ......... G01L 9/0042
257/419
6,631,645 B1 * 10/2003 Satou .................... G01L 9/0073
73/718
(Continued)

FOREIGN PATENT DOCUMENTS

CN 102183677 A 9/2011
CN 102798403 A 11/2012
(Continued)

OTHER PUBLICATIONS

Written Opinion dated Mar. 21, 2016 in International Patent Application No. PCT/CN2015/097314.
(Continued)

*Primary Examiner* — Helen C Kwok
(74) *Attorney, Agent, or Firm* — Venable LLP; Michele V. Frank

(57) ABSTRACT

An integrated structure of an MEMS pressure sensor and an MEMS inertia sensor are provided, comprising: an insulating layer formed on a substrate, a first lower electrode and a second lower electrode both formed on the insulating layer, further comprising a first upper electrode forming an air pressure-sensitive capacitor together with the first lower electrode, and a second upper electrode forming a reference capacitor together with the second lower electrode; further comprising an inertia-sensitive structure supported above the substrate by a third support part, and a fixed electrode plate forming an inertia detecting capacitor of an inertia sensor together with the inertia-sensitive structure; and a cover body which packages the inertia detecting capacitor composed of the inertia-sensitive structure and the fixed electrode plate on the substrate.

8 Claims, 2 Drawing Sheets

(51) Int. Cl.
*G01P 15/125* (2006.01)
*G01P 15/02* (2013.01)
*B81B 3/00* (2006.01)
*B81B 7/00* (2006.01)
*B81C 1/00* (2006.01)
*G01L 19/04* (2006.01)

(52) U.S. Cl.
CPC ...... *B81C 1/00166* (2013.01); *B81C 1/00269* (2013.01); *G01L 9/12* (2013.01); *G01L 19/04* (2013.01); *G01P 15/125* (2013.01); *B81B 2201/0228* (2013.01); *B81B 2201/0235* (2013.01); *B81B 2201/0264* (2013.01); *B81B 2203/04* (2013.01)

(58) Field of Classification Search
CPC ............ B81C 1/00269; B81C 1/00301; B81C 1/00817; B81C 1/00158; B81C 1/00198; B81C 1/00293; B81C 1/00357; G01L 9/12; G01L 9/0073; G01L 9/0042; G01L 9/0085; G01L 19/04; G01P 15/125; G01P 15/0802; G01P 15/08; G01P 15/18; G01P 15/02
See application file for complete search history.

(56) References Cited

U.S. PATENT DOCUMENTS

| | | | | |
|---|---|---|---|---|
| 2010/0242603 | A1* | 9/2010 | Miller | B81B 7/02 73/514.32 |
| 2012/0043627 | A1 | 2/2012 | Lin et al. | |
| 2012/0299127 | A1* | 11/2012 | Fujii | B60C 23/0488 257/415 |
| 2013/0340525 | A1* | 12/2013 | Liu | G01P 15/0802 73/514.11 |
| 2014/0001579 | A1* | 1/2014 | Liu | G01L 9/0073 257/415 |
| 2014/0306300 | A1* | 10/2014 | Gunthner | G01P 15/0802 257/417 |
| 2015/0102437 | A1* | 4/2015 | Liu | B81B 3/0021 257/419 |
| 2015/0123222 | A1* | 5/2015 | Bilic | B81C 1/00825 257/418 |
| 2016/0264403 | A1* | 9/2016 | Chowdhury | B81B 7/02 |
| 2016/0297673 | A1* | 10/2016 | Lagouge | B81B 7/0074 |
| 2017/0081174 | A1* | 3/2017 | Liu | B81B 7/007 |

FOREIGN PATENT DOCUMENTS

| | | |
|---|---|---|
| CN | 103708409 A | 4/2014 |
| CN | 103712720 A | 4/2014 |
| CN | 104555896 A | 4/2015 |
| CN | 104891418 A | 9/2015 |
| CN | 204675826 U | 9/2015 |
| JP | H07007162 A | 1/1995 |
| JP | 2001235381 A | 8/2001 |
| JP | 2007064920 A | 3/2007 |
| JP | 2008140867 A | 6/2008 |
| JP | 2013011587 A | 1/2013 |
| JP | 2014521071 A | 8/2014 |
| JP | 2015077677 A | 4/2015 |
| KR | 20140000173 A | 1/2014 |
| WO | 2012/122876 A1 | 9/2012 |
| WO | 2013/003789 A1 | 1/2013 |

OTHER PUBLICATIONS

International Search Report dated Mar. 21, 2016 in International Patent Application No. PCT/CN2015/097314.
Notification to Grant Patent Right for Invention issued in counterpart Chinese Application No. 2015102887508.
First Search issued in counterpart Chinese application No. 2015102887508.
Office Action issued in counterpart Chinese Application No. 2015102887508 dated Feb. 3, 2016.
Office Action issued in counterpart European Application No. 158940155 dated Jul. 5, 2018.
Supplementary European Search Report issued in counterpart European Application No. 158940155 dated Mar. 14, 2018.
Decision of Refusal issued in counterpart Japanese Application No. 2017-539547 dated Nov. 1, 2018.
Notification of Reasons for Refusal issued in counterpart Japanese Application No. 2017-539547 dated Jun. 14, 2018.
Notice of Final Rejection issued in counterpart Korean Application No. 10-2017-7019439 dated Feb. 27, 2019.
Notification of Reason for Refusal issued in counterpart Korean Application No. 10-2017-7019439 dated Sep. 13, 2018.

* cited by examiner

INTEGRATED STRUCTURE OF MEMS PRESSURE SENSOR AND MEMS INERTIA SENSOR

CROSS REFERENCE TO RELATED APPLICATION

This application is a national stage application, filed under 35 U.S.C. § 371, of International Application No. PCT/CN2015/097314, filed on Dec. 14, 2015, which claims priority to Chinese Application No. 201510288750.8 filed on May 29, 2015, the content of which is hereby incorporated by reference in its entirety.

TECHNICAL FIELD

The present invention relates to the technical field of a sensor, and more particularly, to a structure that integrates an MEMS pressure sensor and an MEMS inertia sensor into one chip.

BACKGROUND

In recent years, with the development of science and technology, the size of electronic products such as cell phones and laptops is continuously decreasing, and people's requirement on the performance of these portable electronic products is higher and higher, which requires that the size of matched electronic parts should also be reduced.

As measuring devices, sensors have been commonly applied in the electronic products such as cell phones and laptops. In current processes and structures, due to the difference in detecting principles, an MEMS inertia sensor and an MEMS pressure sensor chip are generally separated. The MEMS inertia sensor needs airtight space to protect its microstructure, while a sensitive structure of the MEMS pressure sensor needs to contact with the outside. The two devices are designed and processed on different processing platforms respectively, and apply different packaging forms to form independent chips. During assembling, system manufacturers surface-mount the MEMS inertia sensor chip and the MEMS pressure sensor chip on the same main board by way of SMT. As a result, the cost of chips and packaging are increased.

SUMMARY

One purpose of the present invention is to provide a new technical solution of an integrated structure of an MEMS pressure sensor and an MEMS inertia sensor.

According to a first aspect of the present invention, the integrated structure of an MEMS pressure sensor and an MEMS inertia sensor is provided, the structure comprising: a substrate, an insulating layer formed on the substrate, a first lower electrode and a second lower electrode both formed on the insulating layer, further comprising a first upper electrode supported above the first lower electrode by a first support part, and a second upper electrode supported above the second lower electrode by a second support part, wherein the first upper electrode is a pressure-sensitive film and a cavity between the first upper electrode and the first lower electrode is an airtight cavity, so that the first upper electrode and the first lower electrode form an air pressure-sensitive capacitor of the pressure sensor; the second upper electrode and the second lower electrode form a reference capacitor whose capacitance is not changed along with the outside air pressure; the structure further comprising: an inertia-sensitive structure supported above the substrate by a third support part, a fixed electrode plate forming an inertia detecting capacitor of an inertia sensor together with the inertia-sensitive structure, and a cover body which packages the inertia detecting capacitor composed of the inertia-sensitive structure and the fixed electrode plate on the substrate.

Optionally, the second upper electrode is a pressure-sensitive film, the reference capacitor further comprises a position-limiting structure which is used to limit the second upper electrode to deform under application of the outside air pressure.

Optionally, the reference capacitor is provided with a supporting column for supporting the second upper electrode to form the position-limiting structure.

Optionally, the reference capacitor is provided with a pressure balancing hole, the cavity between the second upper electrode and the second lower electrode in the reference capacitor is communicated with the outside via the pressure balancing hole so as to form the position-limiting structure.

Optionally, the cover body further packages the reference capacitor composed of the second upper electrode and the second lower electrode on the substrate.

Optionally, the first upper electrode and the second upper electrode are integrally formed.

Optionally, the first support part, the second support part, and the third support part are made of the same material and have the same height; the first upper electrode, the second upper electrode and the inertia-sensitive structure are made of the same material and have the same height; the first lower electrode and the second lower electrode are made of the same material and have the same height.

Optionally, the lower end faces of the first upper electrode and the second upper electrode are higher than the lower end face of the inertia-sensitive structure.

Optionally, the first support part, the second support part, and the third support part are respectively provided with through holes, conductive materials electrically connected with the first upper electrode, the second upper electrode and the inertial sensitive structure are respectively disposed in the through holes, and the lower ends of the first support part, the second support part, and the third support part form a plurality of corresponding connecting leads, the plurality of corresponding connecting leads trace through the insulating layer and are connected to a bonding pad concentration area on the substrate respectively.

Optionally, the fixed electrode plate is provided on the insulating layer as a third lower electrode of the inertia detecting capacitor.

The integrated structure according to the present invention integrates the MEMS inertia sensor and the MEMS pressure sensor on the same substrate, which can effectively reduce the area of the chip, so as to reduce the cost of the chip; a single packaging can complete the packaging of the entire chip and reduce the cost of the chip packaging. Moreover, since application environments of the air pressure-sensitive capacitor and the reference capacitor are the same, substantially consistent responses can be generated to outside common-mode interference, in this way, common-mode interference signals in output signals of the air pressure-sensitive capacitor can be at least partially filtered using output signals of the reference capacitor, further improving stability of the output signals of the air pressure-sensitive capacitor.

Inventor discovered that in the prior art, the system manufacturers surface-mount the MEMS inertia sensor chip and the MEMS pressure sensor chip to the same main board by way of SMT, as a result, the cost of the chip as well as the cost of packaging are increased. Therefore, the technical task to be realized or the technical problem to be solved by the present invention is never conceived of or anticipated by those skilled in the art. Thus, the present invention provides a new technical solution.

Through the detailed description of the exemplary embodiments of the present invention in the following reference figures, other characteristics and advantages of the present invention will become clearer.

BRIEF DESCRIPTION OF THE DRAWINGS

The accompanying drawings, which are incorporated into the description and form a part thereof, illustrate embodiments consistent with the present invention and, together with the description, serve to explain the principles of the present invention.

DETAILED DESCRIPTION

Here, respective exemplary embodiments of the present invention will be described in detail with reference to the accompanying drawings. It should be noted that unless other specifically explained, relative arrangement, numerical expression formulas and values of the components and steps elaborated in these embodiment do not limit the scope of the present invention.

The description on at least one exemplary embodiment below is merely exemplary and does not limit the present invention and its application or use in any form.

The technologies, methods and devices known by those ordinary skilled in the art in the related art may not be discussed in detail, but under a proper condition, the technologies, methods and devices should be considered as a part of the description.

In all examples shown and discussed herein, explanation on any specific values should be merely exemplary and not restrictive. Therefore, other examples of the exemplary embodiments can have different values.

It should be noted that similar reference signs and letters represent the similar items in the accompanying drawings below, and therefore, once defined in one accompanying drawing, certain item is not required to be further discussed in the subsequent accompanying drawings.

Figure 1:
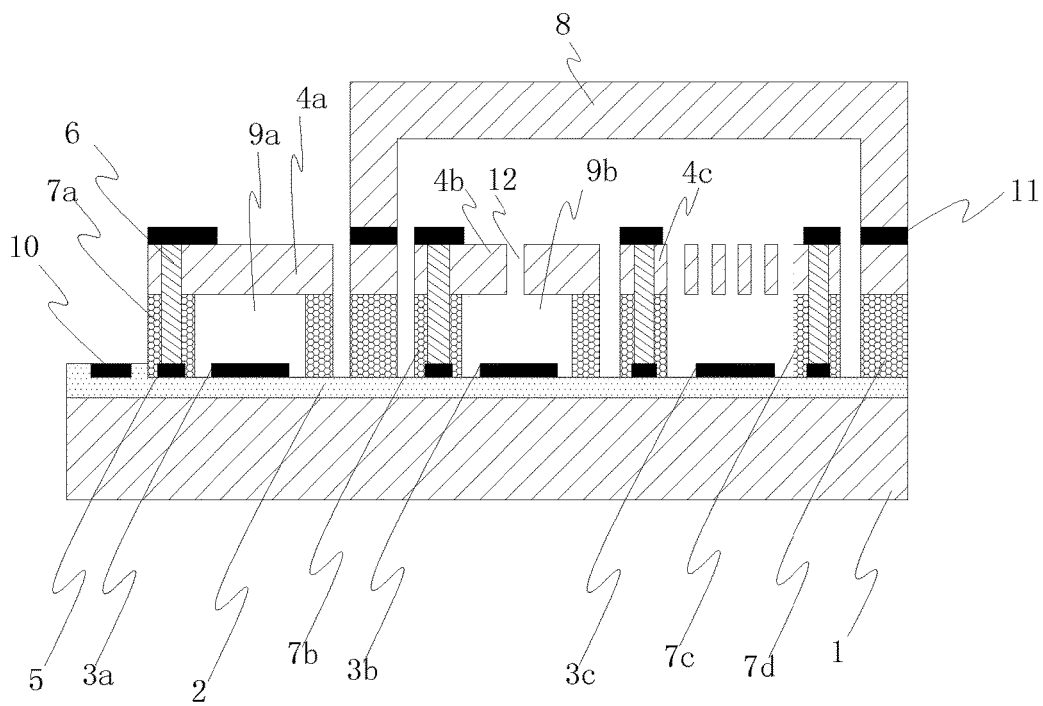
FIG. 1 is a structural schematic diagram of an integrated structure of the present invention.
Figure 2:
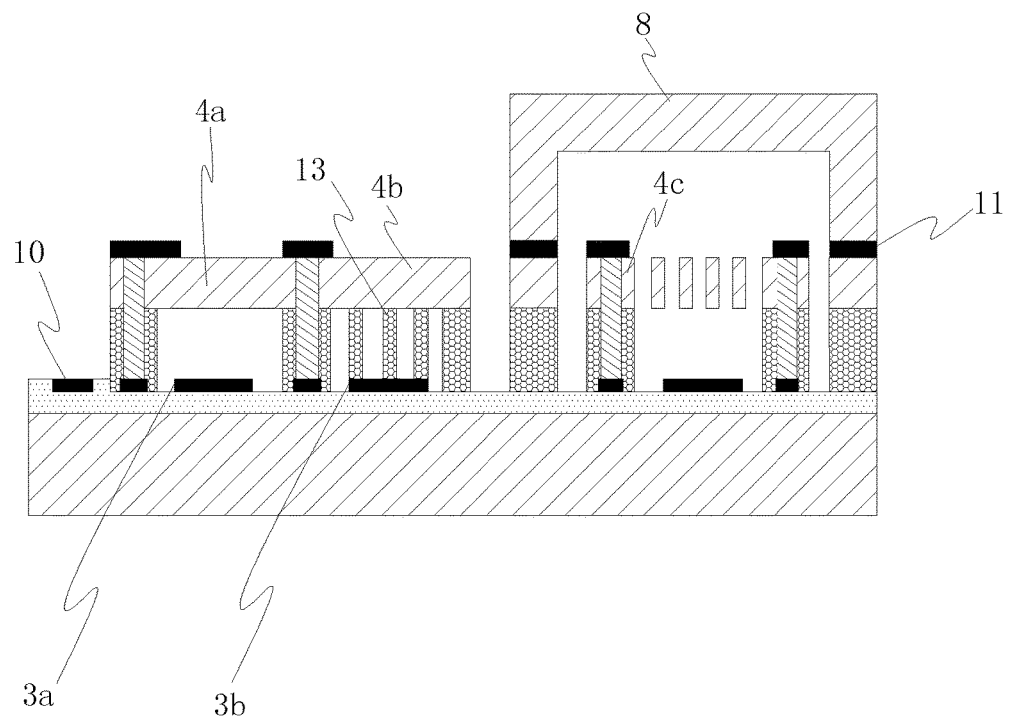
FIG. 2 is a structural schematic diagram of a second embodiment of an integrated structure of the present invention.

Referring to FIGS. 1-2, the present invention provides a integrated structure of an MEMS pressure sensor and an MEMS inertia sensor, comprising: a substrate 1, an insulating layer 2 formed on the substrate 1, a first lower electrode 3a and a second lower electrode 3b both formed on the insulating layer 2, further comprising a first upper electrode 4a supported above the first lower electrode 3a by a first support part 7a, and a second upper electrode 4b supported above the second lower electrode 3b by a second support part 7b, wherein the first upper electrode 4a is a pressure-sensitive film and a cavity between the first upper electrode 4a and the first lower electrode 3a is an airtight cavity 9a, so that the first upper electrode 4a and the first lower electrode 4b form an air pressure-sensitive capacitor of the pressure sensor. Here, in order to eliminate the influence of temperature change on detection precision of the air pressure-sensitive capacitor, and facilitate the achievement of absolute air pressure, the airtight cavity 9a is optionally a vacuum cavity. The second upper electrode 4b and the second lower electrode 3b form a reference capacitor whose capacitance is not changed along with the outside air pressure.

The integrated structure according to the present invention further comprises an inertia-sensitive structure 4c supported above the substrate 1 by a third support part 7c, and a fixed electrode plate forming an inertia detecting capacitor together with the inertia-sensitive structure 4c. The inertia-sensitive structure 4c of the MEMS inertia sensor belongs to prior art for those skilled in the art, which has symmetric movable electrode plates and may be connected to the third support part 7c via an elastic beam structure. In one specific embodiment of the present invention, the fixed electrode plate is disposed on the insulating layer 2 and located below the inertia-sensitive structure 4c as a third lower electrode 3c of the inertia detecting capacitor, so that the MEMS inertia sensor may detect in Z axis. Of course, those skilled in the art may also dispose the fixed electrode plate opposed to the lateral surface of the inertia-sensitive structure 4c so that the fixed electrode plate and the inertia-sensitive structure 4c may form an inertia detecting capacitor that may detect in X axis and Y axis directions. The MEMS inertia sensor of the present invention may be inertia sensors such as an MEMS accelerometer, an MEMS gyroscope and an MEMS resonator.

In the present invention, the insulating layer 2 plays a role in guaranteeing insulation between various parts and the substrate 1. To those skilled in the art, if the substrate 1 per se is made of insulating material, there is no need to set up the insulating layer 2.

Figure 3:
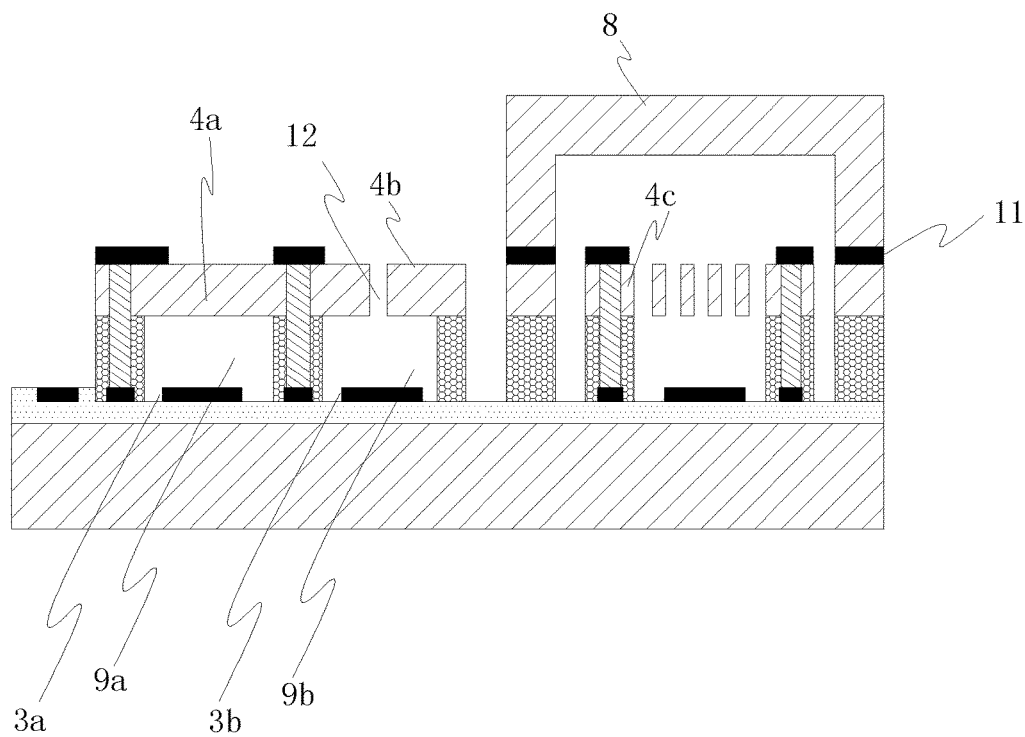
FIG. 3 is a structural schematic diagram of a third embodiment of an integrated structure of the present invention.

Referring to FIGS. 2-3, the integrated structure according to the present invention further comprises a cover body 8 which packages the inertia detecting capacitor composed of the inertia-sensitive structure 4c and the fixed electrode plate on the substrate 1, wherein the cover body 8 may be directly disposed on the insulating layer 2 above the substrate 1. Of course, in order to guarantee consistency of processes, a fourth support part 7d may be disposed on the insulating layer 2, and the cover body 8 and the fourth support part 7d are connected together to form the cavity packaging the inertia detecting capacitor. In the integrated structure of the present invention, the first upper electrode 4a in the air pressure-sensitive capacitor needs to contact with the outside environment to come into play, while the second upper electrode 4b of the reference capacitor does not need to contact with the outside environment. Therefore, the cover body 8 of the present invention may package the reference capacitor composed of the second upper electrode 4b and the second lower electrode 3b on the substrate 1, as shown in FIGS. 1 and 4.

The integrated structure according to the present invention integrates the MEMS inertia sensor and the MEMS pressure sensor on the same substrate, which may effectively reduce the area of the chip, so as to reduce the cost of the chip. A single packaging process may complete the packaging of the entire chip and reduce the cost of the chip packaging. Moreover, since the application environments of the air pressure-sensitive capacitor and the reference capacitor are the same, substantially consistent responses to the outside common-mode interference signals may be generated. In this way, the common-mode interference signal in output signals of the air pressure-sensitive capacitor may be at least partially filtered using the output signal of the reference capacitor, and improving the stability of the output signals of the air pressure-sensitive capacitor.

In the present invention, in order to manufacture and form the above-mentioned air pressure-sensitive capacitor and the reference capacitor through substantially the same process steps, and improve consistency of the responses of the air pressure-sensitive capacitor and the reference capacitor to the outside common-mode interference, the second upper electrode 4b may apply a pressure-sensitive film. Here, the first upper electrode 4a and the second upper electrode 4b may be mutually independent or may be integrated (i.e. the first upper electrode 4a and the second upper electrode 4b are a single pressure-sensitive film), as shown in FIG. 3. At the moment, in order to prevent the second upper electrode 4b from deforming accordingly along with the change of outside air pressure, the reference capacitor further includes a position-limiting structure for constraining the second upper electrode 4b from deforming under the outside air pressure. Furthermore, the second upper electrode 4b may be made of materials that do not deform within the detection range of the pressure sensor of the present invention, and the materials preferably cause the difference in the response of the second upper electrode 4b and the first upper electrode 4a to the change of non-air pressure factors such as temperature to be within the permitted error range of the pressure sensor.

Figure 4:
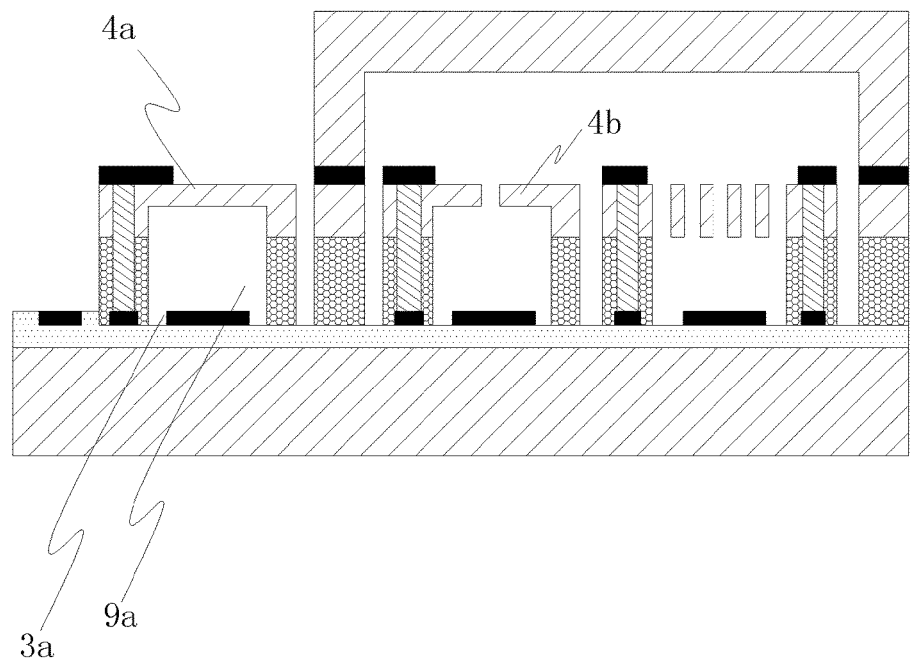
FIG. 4 is a structural schematic diagram of a fourth embodiment of an integrated structure of the present invention.

In a specific embodiment of the present invention, as shown in FIGS. 1, 3 and 4, the position-limiting structure is as follows: a pressure balancing hole 12 is disposed for the reference capacitor so that the cavity 9b between the second upper electrode 4b and the second lower electrode 3b in the reference capacitor is communicated with the outside via the pressure balancing hole 12, in this way, the air pressure within the cavity 9b will change likewise according to the outside air pressure, achieving the purpose of constraining the second upper electrode 4b from deforming under application of the outside air pressure via the pressure balancing hole 12, and obtaining the effect of keeping the positions of the various points on the second upper electrode 4b unchanged. Here, the pressure balancing hole 12 may be disposed on the second upper electrode 4b to simplify the manufacturing process of the pressure sensor. Of course, if it is permitted, the pressure balancing hole 12 may be disposed on the second support part 7b, which may also achieve the same purpose of balancing air pressure.

In another specific embodiment of the present invention, as shown in FIG. 2, the above-mentioned position-limiting structure may be as follows: a supporting column 13 is disposed to support the second upper electrode 4b, the supporting column 13 may be disposed on the second lower electrode 3b. However, since the support column 13 needs to be made of the insulating material, in order to improve the connecting intension of the supporting column 13, the supporting column 13 may also be disposed on the insulating layer 2, which requires to dispose a through hole on the second lower electrode 3b for the supporting column 13 to pass through, so that the supporting column 13 passes through the corresponding through hole and extends upwards until the position of the second upper electrode 4b.

The integrated structure according to the present invention, in order to facilitate manufacturing, the first support part 7a, the second support part 7b, the third support part 7c and the fourth support part 7d are made of the same material, e.g., silica materials, and have the same height; the first upper electrode 4a, the second upper electrode 4b and the inertia-sensitive structure 4c are made of the same material, e.g., monocrystalline silicon materials, and have the same height; the first lower electrode 3a, the second lower electrode 3b and the third lower electrode 3c are made of the same material, e.g., metal materials, and have the same height. And this allows the above various layers to be disposed via deposition layer by layer or bonding, and forms respective structures via graphical process. The manufacturing process of the MEMS inertia sensor is completely compatible with the process of the MEMS pressure sensor. More importantly, the same material, process and size may make the air pressure-sensitive capacitor and the reference capacitor have basically identical initial capacitance, so that the responses of the air pressure-sensitive capacitor and the reference capacitor to the outside common-mode interference are basically identical, so as to filter the common-mode interference signal in the output signals of the air pressure-sensitive capacitor to the maximum degree, and eliminate the influence of output signals of the reference capacitor to effective signals among the output signals of the air pressure-sensitive capacitor.

Based on consistency of the above manufacturing process, in a preferable embodiment of the present invention, in order to improve the sensitivity of the air pressure-sensitive capacitor, and meanwhile guarantee the consistency of the air pressure-sensitive capacitor and the reference capacitor, the lower end faces of the first upper electrode 4a and the second upper electrode 4b are higher than the lower end faces of the inertia-sensitive structure 4c. To be specific, it may be realized by etching and thinning the lower end faces of the first upper electrode 4a and the second upper electrode 4b, thereby increasing the volume of the airtight cavity 9a and the cavity 9b, ensuring the consistency of the air pressure-sensitive capacitor and the reference capacitor and improving sensitivity of the air pressure-sensitive type capacitor. Meanwhile, thinning the lower end face of the first upper electrode 4a may increase the distance from the first upper electrode 4a to the first lower electrode 3a. While preventing high pressure input, the first upper electrode 4a and the first lower electrode 3a are adhered together to cause the air pressure-sensitive capacitor to lose effect.

In the present invention, signals of various electrodes need to be lead out, which may be realized through traditional leads, in a preferable embodiment provided in the present invention, refer to FIG. 1, the first support part 7a, the second support part 7b, and the third support part 7c are respectively provided with through holes, conductive materials 6 electrically connected with the first upper electrode 4a, the second upper electrode 4b and the inertial sensitive structure 4c are respectively disposed in the through holes, so that the signals of the electrodes in the upper part are lead to the lower ends, and the lower ends of the first support part 7a, the second support part 7b, and the third support part 7c form a plurality of corresponding connecting leads 5, the plurality of corresponding connecting leads 5 pass the insulating layer 2 and are respectively connected to a bonding pad concentration area 10 on the substrate 1. For instance, the insulating layer 2 may be designed with a multi-layer structure to make the plurality of connecting leads 5 stagger from each other; such lead passing way belongs to common general knowledge of those skilled in the art and will not be described here in detail.

The present invention further provides a manufacturing method of the above-mentioned integrated structure. The method comprises: first of all, depositing the insulating layer 2 on the substrate 1, wherein the substrate 1 may be made of monocrystalline silicon materials, the insulating layer 2 may be made of silica materials; secondly, depositing a metal layer on an upper surface of the insulating layer 2 and etching the metal layer, forming the bonding pad concentration area 10, the first lower electrode 3a, the second lower electrode 3b and the third lower electrode 3c; after that, depositing another insulating layer and etching to form the first support part 7a, the second support part 7b, the third support part 7c and the fourth support part 7d; bonding the sensitive film layer on the support parts by means of bonding, etching the sensitive film layer, forming the first upper electrode 4a, the second upper electrode 4b and the inertia-sensitive structure 4c. Of course according to requirements, before etching the sensitive film layer, the method may comprise: firstly etching through holes on the first support part 7a, the second support part 7b and the third support part 7c, after bonding the sensitive film layer, etching the sensitive film layer in the through hole position, filling a conductive material 6 to lead electrical signals of the first upper electrode 4a, the second upper electrode 4b and the inertia-sensitive structure 4c to the lower ends, and passing the leads via the insulating layer; in subsequent process, depositing another metal layer on an upper surface of the sensitive film layer, and etching and forming a conductive bonding pad above the conductive material 6 and a metal bonding layer 11 above the fourth support part 7d, finally, bonding the cover body 8 on the fourth support part 7d via the metal binding layer 11. In order to ensure the consistency in structure size, when etching the sensitive film layer, the sensitive film layer above the fourth support part 7d may be retained, and bonded with the cover body 8 via the subsequent metal bonding layer 11.

It should be noted that the above-mentioned insulating layer 2 may be integrated or include a plurality of independent sub-insulating layers corresponding to the air pressure-sensitive capacitor, the reference capacitor and the inertia detecting capacitor respectively; the first support part 7a, the second support part 7b, the third support part 7c and the fourth support part 7d are made of insulating materials, and may be independent from one another or may be an integrated structure.

Although detailed descriptions have been provided to some particular embodiments of the present invention via examples, those skilled in the art shall understand that the examples are only for purpose of illustration and are not to limit the scope of the present invention. Those skilled in the art shall understand that various modifications may be made without departing from the scope and spirit of the present invention. It is intended that the scope of the present invention only be limited by the appended claims.

What is claimed is:

1. A integrated structure of an MEMS pressure sensor and an MEMS inertia sensor, characterized by comprising: a substrate, an insulating layer formed on the substrate, a first lower electrode and a second lower electrode both formed on the insulating layer, further comprising a first upper electrode supported above the first lower electrode by a first support part, and a second upper electrode supported above the second lower electrode by a second support part, wherein the first upper electrode is a pressure-sensitive film and a cavity between the first upper electrode and the first lower electrode is an airtight cavity, so that the first upper electrode and the first lower electrode form an air pressure-sensitive capacitor of the pressure sensor; the second upper electrode and the second lower electrode form a reference capacitor whose capacitance is not changed along with an outside air pressure; the integrated structure further comprising: an inertia-sensitive structure supported above the substrate by a third support part, a fixed electrode plate forming an inertia detecting capacitor of the inertia sensor together with the inertia-sensitive structure, and a cover body which packages the inertia detecting capacitor composed of the inertia-sensitive structure and the fixed electrode plate on the substrate, wherein the first support part, the second support part, and the third support part are made of the same material and have the same height; the first upper electrode, the second upper electrode and the inertia-sensitive structure are made of the same material and have the same height; the first lower electrode and the second lower electrode are made of the same material and have the same height, and wherein lower end faces of the first upper electrode and the second upper electrode are higher than a lower end face of the inertia-sensitive structure.

2. The structure according to claim 1, characterized in that the second upper electrode is a pressure-sensitive film, and the reference capacitor further includes a position-limiting structure which is used to limit the second upper electrode to deform under application of the outside air pressure.

3. The structure according to claim 2, characterized in that the reference capacitor is provided with a supporting column for supporting the second upper electrode to form the position-limiting structure.

4. The structure according to claim 2, characterized in that the reference capacitor is provided with a pressure balancing hole, and a cavity between the second upper electrode and the second lower electrode in the reference capacitor is communicated with an outside via the pressure balancing hole so as to form the position-limiting structure.

5. The structure according to claim 1, characterized in that the cover body further packages the reference capacitor composed of the second upper electrode and the second lower electrode on the substrate.

6. The structure according to claim 1, characterized in that the first upper electrode and the second upper electrode are integrally formed.

7. The structure according to claim 1, characterized in that the first support part, the second support part, and the third support part are respectively provided with through holes; conductive materials electrically connected with the first upper electrode, the second upper electrode and the inertial sensitive structure are respectively disposed in the through holes; and lower ends of the first support part, the second support part and the third support part form a plurality of corresponding connecting leads which trace through the insulating layer and are connected to a bonding pad concentration area on the substrate respectively.

8. The structure according to claim 1, characterized in that the fixed electrode plate is provided on the insulating layer as a third lower electrode of the inertia detecting capacitor.

* * * * *